(12) United States Patent
Liu et al.

(10) Patent No.: US 7,026,061 B2
(45) Date of Patent: Apr. 11, 2006

(54) ORGANIC ELECTROLUMINESCENT MATERIAL AND ORGANIC ELECTROLUMINESCENT ELEMENT BY USING THE SAME

(75) Inventors: Jui Hsiung Liu, Taipei (TW); Hsiang Lun Hsu, Miaoli (TW); Heh Lung Huang, Taipei (TW); Tzu Lin Hsieh, Shindian (TW); Shen-shen Wang, Junghe (TW)

(73) Assignee: RiTdisplay Corporation, Hsinchu (TW)

( * ) Notice: Subject to any disclaimer, the term of this patent is extended or adjusted under 35 U.S.C. 154(b) by 145 days.

(21) Appl. No.: 10/388,513

(22) Filed: Mar. 17, 2003

(65) Prior Publication Data

US 2004/0183432 A1  Sep. 23, 2004

(51) Int. Cl.
*H05B 33/14* (2006.01)
*H01J 1/62* (2006.01)

(52) U.S. Cl. .................. 428/690; 428/917; 313/506; 544/224; 544/338; 257/40

(58) Field of Classification Search .................. 257/40; 428/690, 917; 313/506; 544/224, 338
See application file for complete search history.

(56) References Cited

U.S. PATENT DOCUMENTS

| | | | |
|---|---|---|---|
| 5,121,029 A | 6/1992 | Hosokawa et al. | |
| 5,126,214 A | 6/1992 | Tokailin et al. | |
| 5,130,603 A | 7/1992 | Tokailin et al. | |
| 5,516,577 A | 5/1996 | Matsuura et al. | |
| 5,536,949 A | 7/1996 | Hosokawa et al. | |
| 6,093,864 A | 7/2000 | Tokailin et al. | |
| 2004/0162304 A1* | 8/2004 | Blizzard et al. ............ | 514/278 |

FOREIGN PATENT DOCUMENTS

| | | |
|---|---|---|
| EP | 0 319 881 A2 | 6/1989 |
| JP | 2001307880 A * | 11/2001 |
| WO | WO 02/20459 A1 | 3/2002 |

OTHER PUBLICATIONS

Journal of the Chemistry Society, Perkin Transactins 1: Organic and Bio-Organic Chemistry (13), 1939-1942, (1997).*
Journal of Organic Chemistry, (2000), vol. 65, p. 945-950.*
Justus Liebigs Annalen der Chemie, 740, p. 63-73, (1970).*
Helfrich et al., "Transients of Volume-Controlled Current and of Recombination Radiation in Anthracene," The Journal of Chemical Physics, vol. 44, No. 3, Apr. 15, 1966, pp. 2902-2909.

Vincett et al., "Electrical Conduction and Low Voltage Blue Electroluminescence in Vacuum-Deposited Organic Films," Thin Solid Films, vol. 94, Issue 2, Aug. 1982, p. 171-183.
Tang et al., "Organic electroluminescent diodes," Appl. Phys. Lett, vol. 51, No. 12, Sep. 21, 1987, pp. 913-915.
Behnisch et al., "Synthesis of new 1,3,5-tris-styryl-benzene compounds with tunable photo- and electroluminescent properties," Synthetic Metals, vol. 121, Mar. 2001, p. 1661-1662.
Kim et al., "Synthesis and characterization of star-shaped organic light emitting materials containing long alkyl chain, " Synthetic Metals, vol. 121, Mar. 2001, p. 1665-1666.
Hosokawa et al., "Highly efficient blue eletroluminescence from a distyrylarylene emitting layer with a new dopant," Appl. Phys. Lett., vol. 67, No. 26, Dec. 25, 1995, pp. 3853-3855.
Kwok et al., "Synthesis and characterization of blue-emitting, distyrylstilbenes bearing electron affinitive dendrons," Materials Science and Engineering, vol. B85, Aug. 2001, p. 126-130.

* cited by examiner

*Primary Examiner*—Dawn Garrett
(74) *Attorney, Agent, or Firm*—Jiang Chyun IP Office

(57) ABSTRACT

An organic electroluminescent material of the formula:

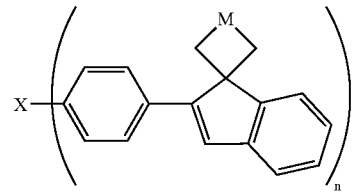

wherein M is at least one selected from the group consisting of —$CH_2$—, —$CH_2CH_2$—, —$CH_2CH_2CH_2$—, —$CH_2C(CH_3)_2CH_2$—, and —$CH_2YCH_2$—, X is at least one selected from the group consisting of oxygen, sulfur, nitrogen, carbon, alkyl, silicon, silyl, phosphorus, aryl, and polyaryl, and n is depending on the amount of free radicals of X. Y is at least one selected from the group consisting of oxygen, sulfur, nitrogen and $SiR^1R^2$. Wherein, $R^1$ and $R^2$ is at least one selected from the group consisting of substituted or unsubstituted alkyl having 1 to 10 carbon atoms, and substituted or unsubstituted aryl having 6 to 30 carbon atoms. This invention also discloses an organic electroluminescent element having the organic electroluminescent material.

23 Claims, 1 Drawing Sheet

ORGANIC ELECTROLUMINESCENT MATERIAL AND ORGANIC ELECTROLUMINESCENT ELEMENT BY USING THE SAME

BACKGROUND OF THE INVENTION

1. Field of Invention

This invention relates to a luminescent material and element and, more particular, to an organic electroluminescent (EL) material and an organic EL element.

2. Related Art

Following the advances in electrical technology, light and high efficiency displays, such as liquid crystal displays (LCD), are well developed. However, the LCD has several drawbacks: the narrow viewing angle, the response time which is not fast enough to display high-speed animation, and the increased power requirement for driving the panel. Moreover, a large panel cannot be easily manufactured in LCD structures.

Compared to the LCD, organic light-emitting diodes are self-emissive, have a full viewing angle, are high power efficient, are easily manufactured, are low cost, have a fast response time, and are full color. Therefore, organic light-emitting diodes could be the major flat display and light source, including use as special light sources and for normal illumination, in the future.

Referring to FIG. 1, an organic light-emitting diode 1 includes a substrate 11, a first electrode 12, an organic EL layer 13, and a second electrode 14. When applying a direct current to the diode 1, holes are injected from the first electrode 12 into the organic EL layer 13 while electrons are injected from the second electrode 14. Based on the applied voltage, the holes and electrons are moved in the organic EL layer 13, and are combined to generate excitons. The excitons can excite organic EL materials of the organic EL layer 13, so that the excited organic EL materials emit light to release energy.

Those skilled in the art should know that organic light-emitting diodes utilize the self-emissive of organic functional materials to achieve the objective of displaying.

The organic compound of the organic EL layer has been long studied. For example, W. Helfrish, Dresmer, Williams, et al. succeeded in emission of blue light using anthracene crystals (J. Chem. Phys., 44, 2902 (1966)). Vincett, Barlow, et al. produced a light emitting device by a vapor deposition method, using a condensed polycyclic aromatic compound (Thin Solid Films, 94, 171 (1982)). However, only a light emitting device low in luminance and luminous efficiency has been obtained.

In 1987, C. W. Tang and S. A. Van Slyke disclosed an organic EL layer structure having an organic thin film and a transporting thin film. The transporting thin film is a hole transporting layer or an electron transporting layer. It is reported that the maximum luminance provided is more than 1,000 cd/m$^2$ and an efficiency of 1 lm/W (Appl. Phys. Lett., Vol. 51, 913 (1987)).

After that, scientists developed another organic EL layer structure having three layers to decrease driving voltage of the diode and to increase the maximum luminescence. In this case, the organic EL layer structure having a luminescent layer, a hole transporting layer, and an electron transporting layer.

It is also reported that a distyrylbenzene compound well known as laser dye exhibits high fluorescent properties in the region of blue to blue green, and a light emitting material using the distyrylbenzene compound in a single layer form emits EL light of about 80 cd/m$^2$ (European Patent 0319881). In the recent 10 years, Idemitsu Kosan Co. disclosed derivatives of distyrylbenzene compounds and has many granted patents such as U.S. Pat. Nos. 5,121,029, 5,126,214, 5,130,603, 5,516,577, 5,536,949, 6,093,864, WO 02/20459, and et al. In addition, the styrylbenzene compound and its derivatives are reported in Synthetic Metal 121 (2001) 1661, Synthetic Metal 121 (2001) 1665, Appl. Phys. Lett. 67 (26) 1995, Materials Science, and Engineering B85 (2001) 126.

Although derivatives of distyrylbenzene compounds are well studied utilizing in organic EL material and EL element, there are still several drawbacks such as low luminance and emitting efficiency, high driving voltage, color impurity, and et al. For example, as disclosed in U.S. Pat. No. 5,130,603, N,N'-diphenyl-N,N'-bis-(3-methylphenyl)-[1,1'-biphenyl]-4,4'-diamine (TPD) is used in a hole transporting layer, and 2,5-bis(2,2-di-p-tolyvinyl)xylene (DTVX) is used in a luminescent layer. When applying 5 volts, the luminance of the EL element having TPD and DTVX is 300 cd/m$^2$, and the luminescent wavelength of the element is 486 nm. When applying 7 volts, the maximum luminance of the EL device is 1,000 cd/m$^2$. In addition, as disclosed in U.S. Pat. No. 5,536,949, TPD is used in the hole transporting layer, 4,4'-Bis(2,2-diphenylvinyl)biphenyl (DPVBi) is used in the luminescent layer which doped with 4,4'-Bis[2-{4-(N,N-diphenylamino)pheny}vinyl]biphenyl (DPAVBi), and 8-hydroxyquinoline is used in the electron transporting layer. In this case, when applying 8 volts, the luminance of the EL element is 400 cd/m$^2$, and the luminescent wavelength of the element is 494 nm. In U.S. Pat. No. 6,093,864, the EL element has similar properties as mentioned above. In this case, derivatives of distyrylbenzene compounds are formed in the organic EL element by the evaporation method. However, these molecules are thermally unstable, so that they could be thermally degraded during the testing of the manufacturing processes.

Alternatively, some scientists have disclosed that tris-styrylbenzene compounds (Synthetic Metal 121 (2001) 1661) or tetrakis-styrylbenzene compounds (Synthetic Metal 121 (2001) 1665) can be used in the luminescent layer. In practice, however, the luminous efficiency of the organic EL element having those compounds is unsatisfactory, and it is difficult and complex to manufacture an organic EL element having those compounds.

Therefore, it is an important objective of the invention to provide an organic EL material and EL element that can improve luminance, emitting efficiency, driving voltage, and color impurity. Furthermore, the organic EL material and EL element of this invention can also improve thermal stability to prevent thermal degradation.

SUMMARY OF THE INVENTION

In view of the above-mentioned problems, an objective of the current invention is to provide an organic EL material and EL element, which has enhanced luminance and emitting efficiency, lowered driving voltage, increased color purity, and high thermal stability.

To achieve the above objective, the invention provides an organic EL material of the formula (I):

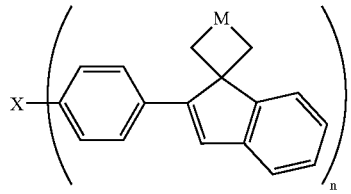

(I)

wherein M is at least one selected from the group consisting of —CH$_2$—, —CH$_2$CH$_2$—, —CH$_2$CH$_2$CH$_2$—, —CH$_2$C(CH$_3$)$_2$CH$_2$—, and —CH$_2$YCH$_2$—, X is at least one selected from the group consisting of oxygen, sulfur, nitrogen, carbon, alkyl, silicon, silyl, phosphorus, aryl, and polyaryl, and n is depending on the amount of free radicals of X. Y is at least one selected from the group consisting of oxygen, sulfur, nitrogen and SiR$^1$R$^2$. Wherein, R$^1$ and R$^2$ are at least one selected from the group consisting of substituted or unsubstituted alkyl having 1 to 10 carbon atoms, and substituted or unsubstituted aryl having 6 to 30 carbon atoms.

Moreover, this invention also provides an EL element, which includes two electrodes and an organic EL layer sandwiched between the electrodes. In this invention, the organic EL layer includes the mentioned organic EL material.

BRIEF DESCRIPTION OF THE DRAWINGS

The invention will become more fully understood from the detailed description given in the herein below illustration only, and thus are not limitative of the present invention, and wherein.

DETAILED DESCRIPTION OF THE INVENTION

Figure 1:
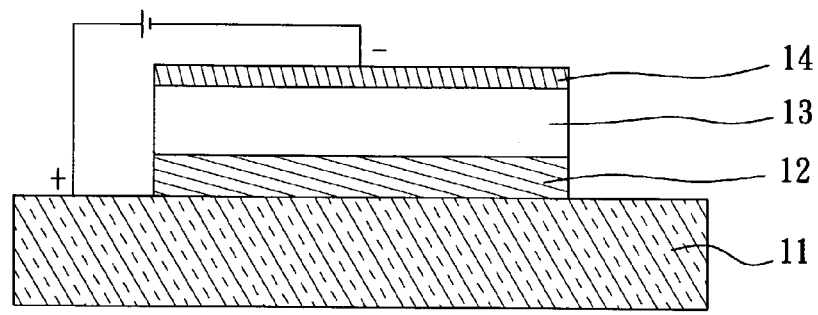
FIG. 1 is a schematic illustration showing a conventional organic light-emitting diode.

The present invention will hereinafter be explained in detail.

In this invention, an organic EL material of the general formula (I):

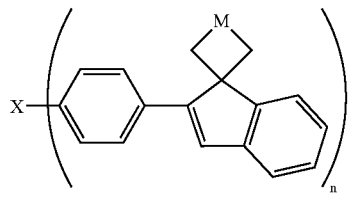

(I)

is used.

In the above general formula (I), M is at least one selected from the group consisting of —CH$_2$—, —CH$_2$CH$_2$—, —CH$_2$CH$_2$CH$_2$—, —CH$_2$C(CH$_3$)$_2$CH$_2$—, and —CH$_2$YCH$_2$—. In this embodiment, X is at least one selected from the group consisting of oxygen, sulfur, nitrogen, carbon, alkyl, silicon, silyl, phosphorus, aryl, and polyaryl. More specifically, X is at least one selected from the group consisting of O$^{2-}$, S$^{2-}$, N$^{3-}$, C$^{4+}$, alkyl Si$^{4+}$, silyl, p$^{2-}$, substituted or unsubstituted aryl having 6 to 30 carbon atoms, and substituted or unsubstituted polyaryl having 6 to 30 carbon atoms. Y is at least one selected from the group consisting of oxygen, sulfur, nitrogen and SiR$^1$R$^2$. Wherein, R$^1$ and R$^2$ are at least one selected from the group consisting of substituted or unsubstituted alkyl having 1 to 10 carbon atoms, and substituted or unsubstituted aryl having 6 to 30 carbon atoms. In this presented embodiment, representative examples of the mentioned aryl group are shown below.

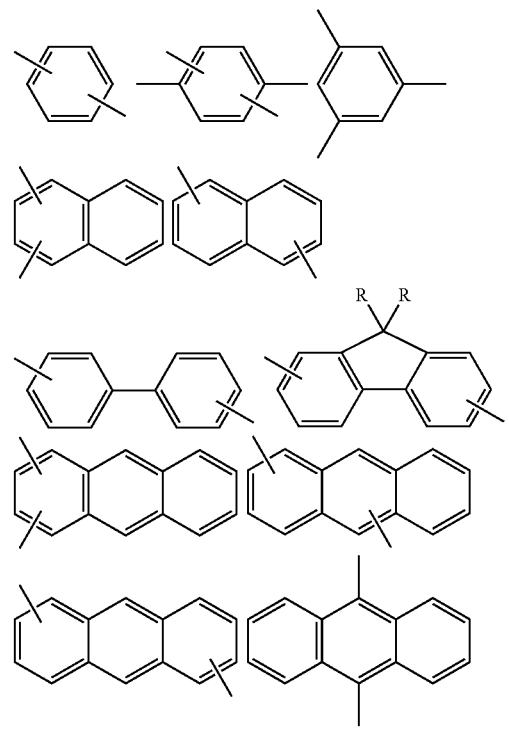

Wherein, R is at least one selected from the group consisting of hydrogen, halogen, nitryl, alkyl, cycloalkyl, alkyloxy, alkenyl, amine, aryl, polyaryl, arylalkyl, and propenyloxy. More specifically, R is at least one selected from the substituted or unsubstituted group consisting of alkyl having 1 to 10 carbon atoms, cycloalkyl having 1 to 10 carbon atoms, alkyloxy having 1 to 10 carbon atoms, alkenyl having 1 to 10 carbon atoms, amine, aryl having 6 to 30 carbon atoms, polyaryl having 6 to 30 carbon atoms, arylalkyl having 6 to 30 carbon atoms, and propenyloxy having 1 to 10 carbon atoms.

X is at least one selected from the group consisting of oxygen, sulfur, nitrogen, carbon, alkyl, silicon, silyl, phosphorus, aryl, and polyaryl. More specifically, X is at least one selected from the group consisting of O$^{2-}$, S$^{2-}$, N$^{3-}$, C$^{4+}$, alkyl Si$^{4+}$, silyl, p$^{2-}$, substituted or unsubstituted aryl having 6 to 30 carbon atoms, and substituted or unsubstituted polyaryl having 6 to 30 carbon atoms. In this embodiment, representative examples of the mentioned aryl group are shown below.

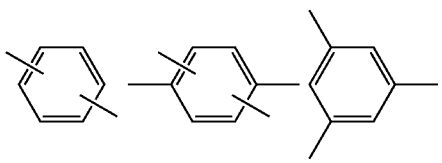
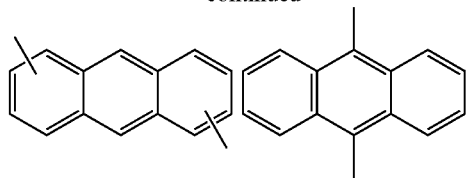

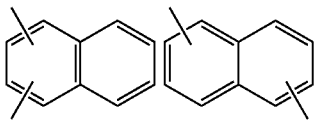

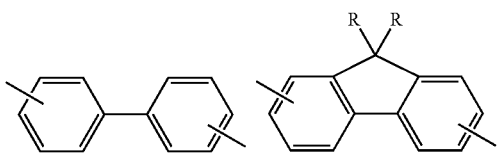

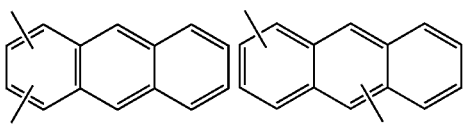

Wherein, R is at least one selected from the group consisting of hydrogen, halogen, nitryl, alkyl, cycloalkyl, alkyloxy, alkenyl, amine, aryl, polyaryl, arylalkyl, and propenyloxy. More specifically, R is at least one selected from the substituted or unsubstituted group consisting of alkyl having 1 to 10 carbon atoms, cycloalkyl having 1 to 10 carbon atoms, alkyloxy having 1 to 10 carbon atoms, alkenyl having 1 to 10 carbon atoms, amine, aryl having 6 to 30 carbon atoms, polyaryl having 6 to 30 carbon atoms, arylalkyl having 6 to 30 carbon atoms, and propenyloxy having 1 to 10 carbon atoms.

Referring again to general formula (I), n is depending on the amount of free radicals of X. For example, n is 2 while X is $O^{2-}$, n is 3 while X is $N^{3-}$, and n is 4 while X is $C^{4+}$. In addition, n is 3 while X is aryl having three free radicals.

As a result, the organic EL material according to the presented embodiment of the invention could be the compound shown below.

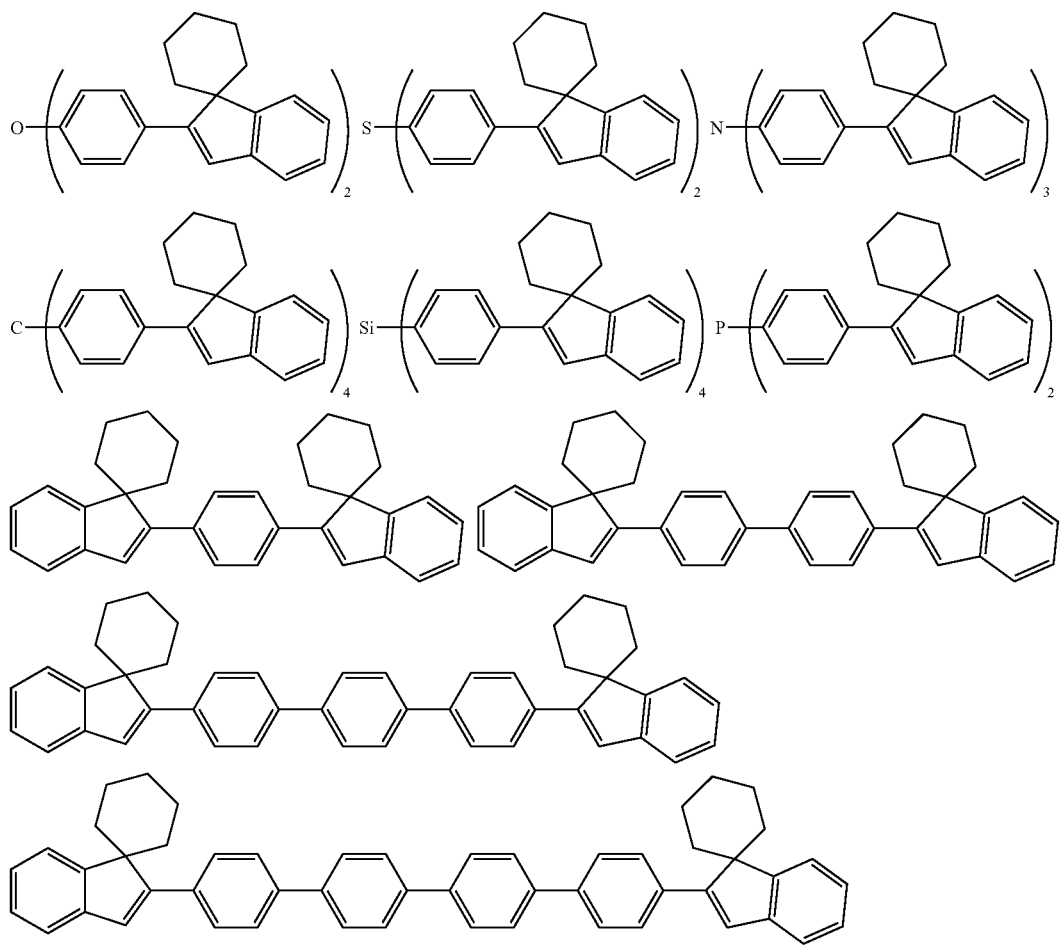

-continued
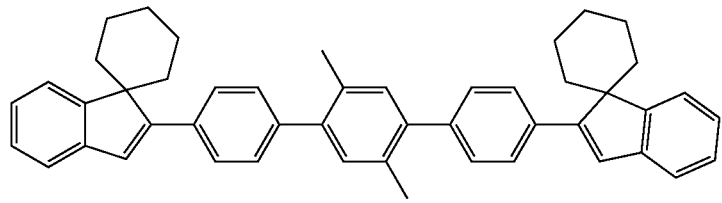
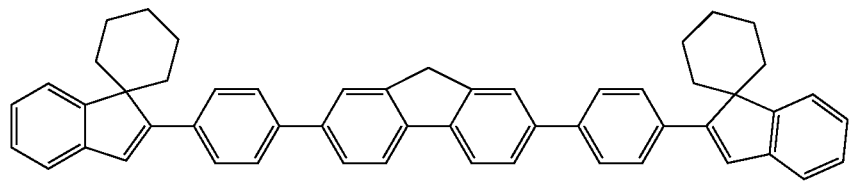
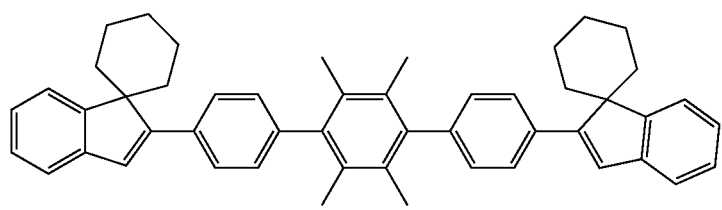
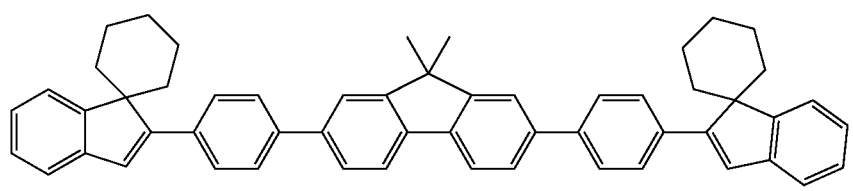
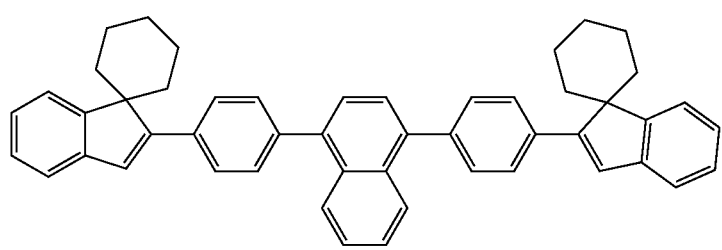
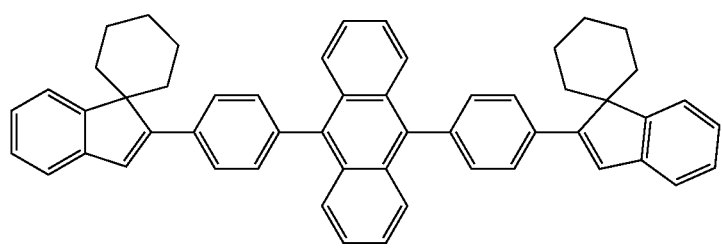

-continued

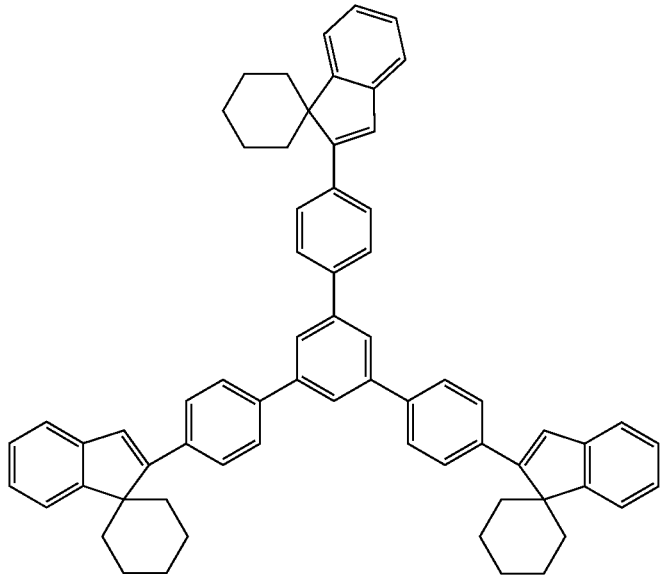

As mentioned above, in the present embodiment, X has at least two free radicals, and n is at least 2. In general, X may have two to four free radicals, and n is 2~4 correspondingly.

Furthermore, in another embodiment of this invention, the mentioned organic EL material is applied in an organic EL element, including a substrate, a first electrode, an organic EL layer, and a second electrode.

In the embodiment, the first electrode is formed on the substrate, the organic EL layer is formed on the first electrode, and the second electrode is formed on the organic EL layer.

The substrate is a transparent substrate such as a plastic substrate or a flexible substrate. In this embodiment, the plastic substrate or the flexible substrate may be a polycarbonate (PC) substrate or a polyester (PET) substrate.

The first electrode is a transparent anode and is formed on the substrate by utilizing sputtering or ion plating. The first electrode can be made of a conductive metal oxide such as indium-tin oxide (ITO), aluminum-zinc oxide (AZO), or indium-zinc oxide (IZO).

The organic EL layer includes the mentioned organic EL material represented by the general formula (I). In general, the organic EL layer has at least one deposited layer. Herein below are examples of the structure of the organic EL layer between the anode and the cathode.

(1) anode/luminescent layer/cathode
(2) anode/luminescent layer/electron transporting layer/cathode
(3) anode/hole transporting layer/luminescent layer/cathode
(4) anode/hole transporting layer/luminescent layer/electron transporting layer/cathode
(5) anode/hole injecting layer/hole transporting layer/luminescent layer/cathode
(6) anode/hole injecting layer/hole transporting layer/luminescent layer/electron transporting layer/cathode
(7) anode/hole injecting layer/hole transporting layer/luminescent layer/electron transporting layer/electron injecting layer/cathode In the current embodiment, the luminescent layer is composed of the mentioned organic EL material of general formula (1). In addition, the organic EL material can be a dopant of the luminescent layer, and the doping ratio of the organic EL material is greater than 0.01 wt % or less than 10 wt %. The luminescent layer can further include an aryl amino compound substituted with an aryl group or a polyaryl group, an aryl bi-amino compound substituted with an aryl group or a polyaryl group, or an aryl tri-amino compound substituted with an aryl group or a polyaryl group. Therefore, the glass transition temperature of the luminescent layer is higher than 100° C.

Moreover, the mentioned organic EL material of general formula (I) also can be doped in the hole transporting layer of the organic EL layer.

As mentioned above, the hole injecting layer is mainly composed of copper phthalocyanine (CuPc), the hole transporting layer is mainly composed of 4,4'-bis[N-(1-naphthyl)-N-phenylamino]biphenyl (NPB), the electron injecting layer is mainly composed of lithium fluoride (LiF), and the electron transporting layer is mainly composed of tris(8-quinolinato-N1,O8)-aluminum (Alq3). Each layer of the organic EL layer can be formed upon the first electrode by utilizing evaporation, spin coating, ink jet printing, or printing. In this case, the organic EL material of general formula (I) can be formed by utilizing evaporation, molecular beam evaporation (MBE), immersion, spin coating, casting, bar code, or roll coating. To be noticed, each layer of the organic EL layer should not be too thin so as to avoid defects such as pin holes, and it should not be too thick so as to avoid higher driving voltage and lower efficiency. In general, each layer of the organic EL layer has a thickness of about 1 nm to 1 μm.

The second electrode is a cathode and formed by utilizing evaporation, E-gun coating, or sputtering. In the current embodiment, the second electrode is made of aluminum, aluminum/lithium fluoride, calcium, magnesium-silver alloys or silver.

The present invention is described in greater detail with reference to the following examples.

EXAMPLE 1

This example illustrates a synthesis method of the organic EL material according to an embodiment of this invention.

First, 16.4 g of sodium hydroxide is mixed with dried n-hexane for 10 minutes, and then the n-hexane is removed in vacuum. After that, 150 ml of dried ethylene glycol dimethyl ether is added, and then 20.0 g of 1-H-indene is added slowly in ice-water bath. After removing ice water bath, the solution is posited in oil bath and heated to 70 ° C. for 3 hours. Then, 39.65 g of 1,5-dibromopentane is added, and the solution is maintained at 70° C. for 12 hours. After removing the oil bath, a saturated ammonium chloride solution is added in ice-water bath, and the solution is extracted by n-hexane for several times. Then, the extracted solution is dehydrated by MgSO$_4$ and n-hexane is almost distilled away to obtain a crude product. The crude product is concentrated under vacuum pressure to obtain 1.1 g of compound 1 (35%).

Next, 10.0 g of potassium bromide (KBr) is dissolved in 60 ml of distilled water, and then 6.0 g of bromine (Br$_2$) is added. After well mixed, bromine water is obtained. The bromine water is dropt into 5.0 g of compound 1 under ice-water bath, and the solution is stirred until the solution turns and maintains red. Finally, the solution is extracted by dichloromethane, and the extracted solution is dehydrated by MgSO$_4$. After concentrated, a yellow transparent oil-like compound 2 is obtained.

Then, compound 2 is dissolved in 80 ml of toluene, and 0.7 g of toluenesulfonic acid is added into the solution. The solution is then heated and refluxed for 12 hours. After that, saturated ammonium chloride solution is added, and the solution is extracted by ethyl ether for several times. The extracted solution is dehydrated by MgSO$_4$, and concentrated to obtain a crude product. Finally, the concentrated solution is distilled under reduced pressure to obtain a yellow transparent oil-like compound 3 (5.22 g, 73%).

Next, 4.0 g of compound 3 is dissolved in 50 ml of tetrahydrofuran, and the solution is cooled to −100° C. Then, 7.42 ml of 2.5M n-BuLi is added slowly, and the solution is maintained below −80° C. for 1 hour. After that, 2.37 g of dried B(OMe)$_3$ is added slowly. After reacting for 2 hours, 3N HCl is used to terminate the reaction. The solution is then extracted by dichloromethane and dehydrated by MgSO$_4$. The solution is concentrated to obtain a crude product. The crude product is purified with silica gel column chromatography to obtain a white solid. This white solid is compound 4 (1.78 g, 51%).

Finally, 2.0 g of compound 4 and 1.28 g of tris-(4-bromophenyl)-amine are dissolved in 30 ml of tetrahydrofuran. Then, oxygen is removed under reduced pressure, wherein the container for the solution is cooled by liquid nitrogen and exhausted for three times. Next, 0.31 g of Pd(PPh$_3$)$_4$, 4.84 g of Ba(OH)$_2$ 8H$_2$O, and 20 ml of methanol/water (9:1) are added and oxygen is removed again as mentioned above. After the solution reacts for three days at room temperature, 10 ml of 3N HCl is added into the solution to terminate the reaction. The solution is then extracted by dichloromethane, dehydrated by MgSO$_4$, and concentrated to obtain a crude product. The crude product is purified with silica gel column chromatography to obtain a yellow solid, which is 1.13 g of compound 5 (54%).

The procedures of synthesis compound 1, compound 2, compound 3, compound 4, and compound 5 are shown herein below:

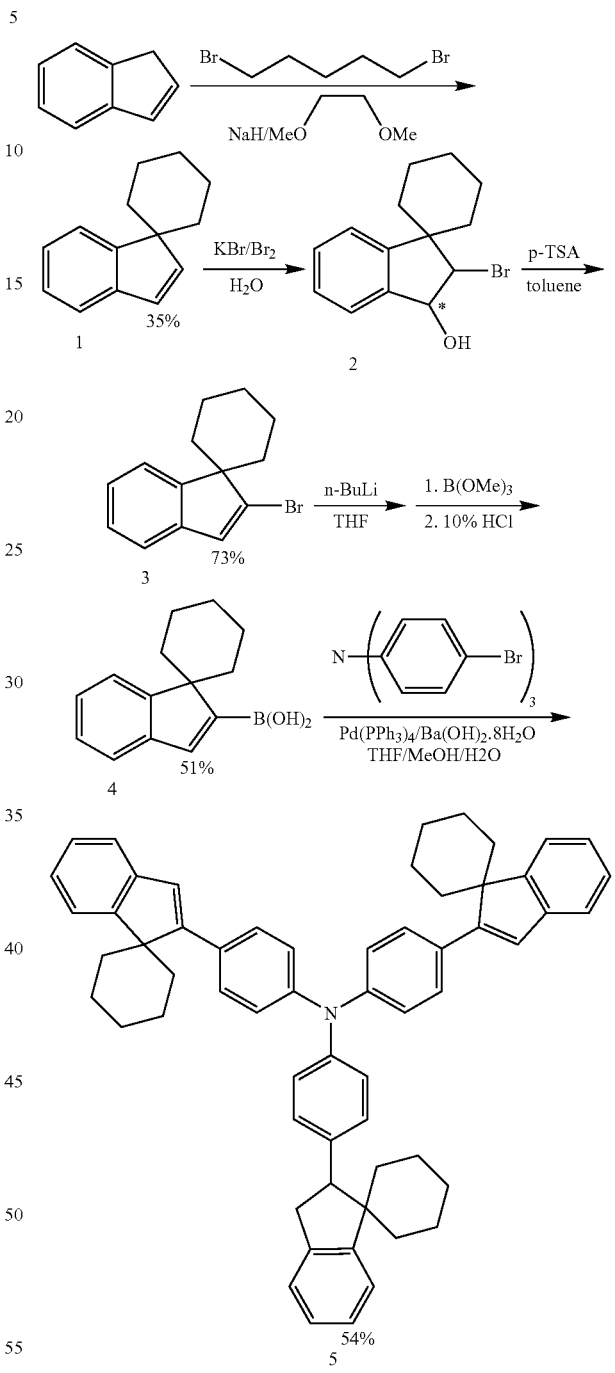

The results of a $^1$H-NMR (CDCl$_3$, 400 MHz) analysis of compound 5 are δ=7.83 (d, J=8.0 Hz, 3H), 7.44 (d, J=8.8 Hz, 6H), 7.35 (d, J=7.6 Hz, 3H), 7.27 (d, J=7.2 Hz, 3H), 7.17 (d, J=8.8 Hz, 6H), 7.13 (d, J=7.6 Hz, 3H), 6.83 (s, 3H), 2.19–1.91 (m, 9H), 1.79 (m, 6H), 1.39 (m, 9H), 0.89 (m, 6H); $^{13}$C NMR(CDCl$_3$, 100 MHz): δ=156.5, 153.4, 146.3, 142.5, 129.2, 129.1, 126.8, 126.7, 126.5, 124.5, 124.0, 123.6, 123.5, 121.1, 54.8, 31.6, 31.6, 25.2, 22.4, 22.4. The results of an elemental analysis are as follows. The values in the parentheses are theoretical values, wherein C is 90.98%, H is 7.25%, and N is 1.77%. The glass transition temperature of compound 5 is 115° C.

EXAMPLE 2

This example illustrates the manufacturing of the EL element according to the embodiment of this invention.

First, a 100 mm×100 mm glass substrate is provided, wherein an ITO layer with a thickness of 150 nm is formed on the glass substrate. After photolithography and etch processes, a pattern of 10 mm×10 mm emitting region is formed. In the condition of $10^{-5}$, Pa, a hole transporting material, such as TPD or NPB (N,N'-diphenyl-N,N'-bis-(1-naphthalenyl)-[1,1'-biphenyl]-4,4'-diamine), is formed on the glass substrate utilizing the evaporation method. In this case, the evaporation ratio of the hole transporting material is maintained at 0.2 nm/sec. The formulas of TPD and NPB are as follows:

TPD:
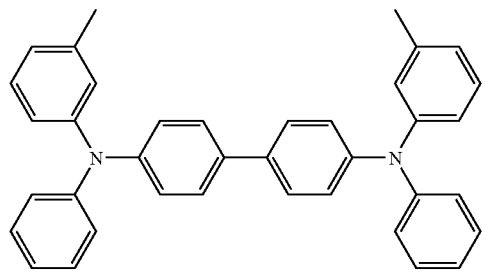

NPB:
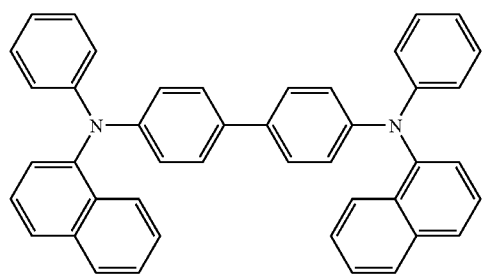

Next, an organic EL material of the compound 5 is formed on the hole transporting material as a luminescent layer. The thickness of the luminescent layer is about 45 nm, and the evaporation ratio of the organic EL material is maintained at 0.2 nm/sec.

Then, AlQ3 (tris(8-quinolino)aluminum) of the following formula is formed on the luminescent layer as an electron transporting layer. The thickness of the electron transporting layer is about 20 nm, and the evaporation ratio of AlQ3 is 0.2 nm/sec.

AlQ3:
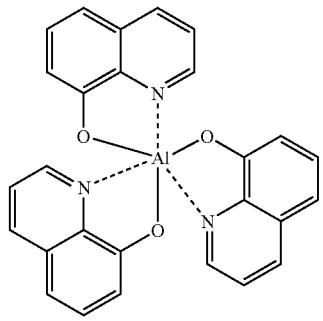

Finally, lithium fluoride (LiF) and aluminum (Al) are formed on the electron transporting layer as a cathode, and have a thickness of 1.2 nm and 150 nm, respectively. Following the steps, an organic EL element according to an embodiment of this invention is completed.

Figure 2:
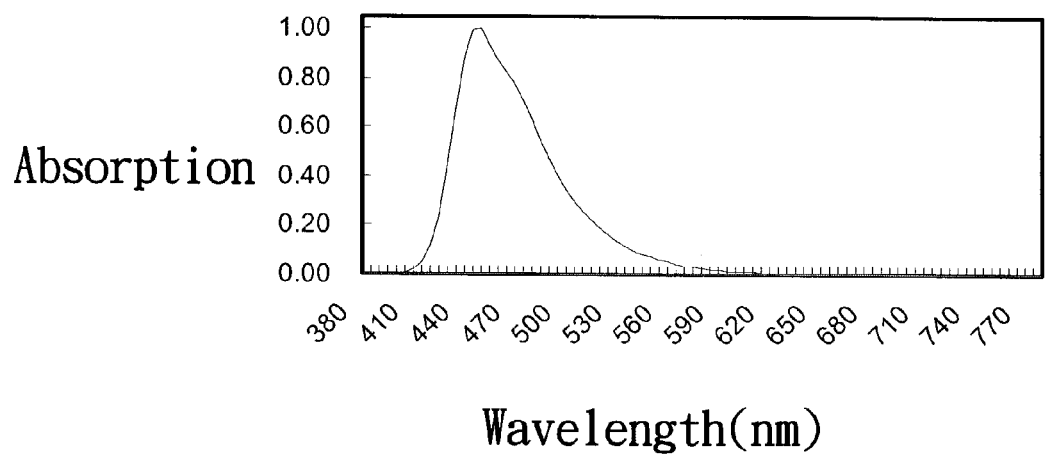
FIG. 2 is a coordinate figure showing EL spectrum of an EL element according to an embodiment of the invention.

In this case, the luminescent qualities of the organic EL element according to the embodiment are measured with direct current using Keithly 2000. Then, the organic EL element emitting blue light is obtained. Furthermore, the EL spectrum of the organic EL element is measured using a spectrum meter manufactured by Otsuka Electronic Co., wherein the detector is a photodiode array. In this case, the EL spectrum is shown in FIG. 2, and a luminescent wavelength of 455 nm is obtained. With reference to a current vs. luminance (I-B) curve and a current vs. voltage (I-V) curve of the organic EL element according to the embodiment of the invention, it is obvious that when 6 volts are applied, the luminance of the organic EL element is 2800 cd/m², the current density is 244 mA/cm², the efficiency is 0.45 lm/W or 1.15 cd/A, and the C.I.E. chromaticity coordinates are (X 0.16, Y 0.11).

EXAMPLE 3

This example compares the organic EL material according to an embodiment of this invention with conventional organic EL materials.

A conventional organic EL material is represented by the following formula (II):

(II)
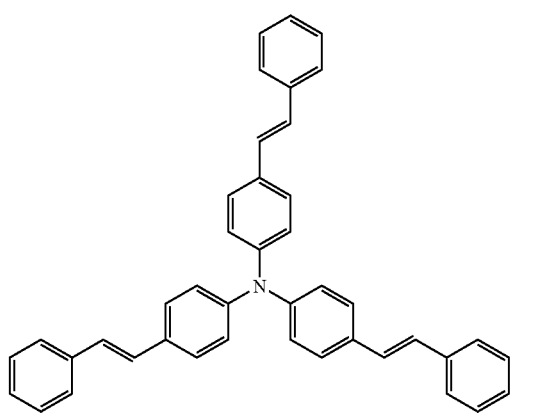

In this prior art, when the organic EL material of formula (II) is utilized to form a luminescent layer of a conventional organic EL element, the luminance of this organic EL element is 2500 cd/m², the current density is 244 mA/cm², the efficiency is 0.23 lm/W or 0.58 cd/A, and the C.I.E. chromaticity coordinates are (X 0.17, Y 0.13) while 6 volts are applied.

It is obvious that the organic EL element having the organic EL material of formula (I) is better than that having the organic EL material of formula (II) both in maximum luminance and luminous efficiency.

It should be noticed that the organic EL material of formula (I) according to this invention is a symmetric compound, so that it has a higher glass transition temperature. Therefore, thermal degradation of the organic EL material of formula (I) during manufacturing processes would not easily occur. In other words, the organic EL material of formula (I) has an improved thermal stability.

In summary, the organic EL material and EL element of the presented invention can improve luminance, emitting efficiency, driving voltage, color impurity, and thermal stability.

While the invention has been described by way of example and in terms of the preferred embodiment, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An organic electroluminescent material of the formula:

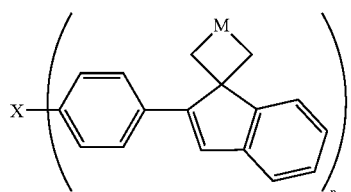

wherein M is at least one selected from the group consisting of —CH$_2$—, —CH$_2$CH$_2$—, —CH$_2$CH$_2$CH$_2$—, —CH$_2$C(CH$_3$)$_2$CH$_2$—, and —CH$_2$YCH$_2$—, X is at least one selected from the group consisting of oxygen, sulfur, nitrogen, carbon, alkyl, silicon, silyl, phosphorus, aryl, and polyaryl, n is depending on the amount of free radicals of X, and Y is at least one selected from the group consisting of oxygen, sulfur, nitrogen and SiR$^1$R$^2$, R$^1$ and R$^2$ being at least one selected from the group consisting of substituted or unsubstituted alkyl having 1 to 10 carbon atoms, and substituted or unsubstituted aryl having 6 to 30 carbon atoms.

2. The organic electroluminescent material of claim 1, wherein X is at least one selected from the group consisting of:

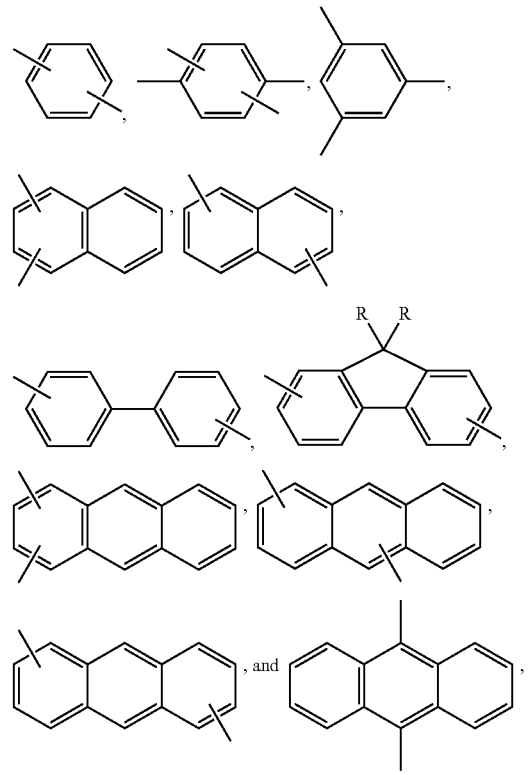

wherein, R is at least one selected from the group consisting of hydrogen, halogen, nitryl, alkyl, cycloalkyl, alkyloxy, alkenyl, amine, aryl, polyaryl, arylalkyl, and propenyloxy.

3. The organic electroluminescent material of claim 1, wherein R$^1$ and R$^2$ are at least one selected from the substituted or unsubstituted group consisting of cycloalkyl having 1 to 10 carbon atoms, polyaryl having 6 to 30 carbon atoms, and arylalkyl having 6 to 30 carbon atoms.

4. The organic electroluminescent material of claim 1, wherein X is at least one selected from the substituted or unsubstituted group consisting of aryl having 6 to 30 carbon atoms, and polyaryl having 6 to 30 carbon atoms.

5. The organic electroluminescent material of claim 4, wherein X is at least one selected from the group consisting of:

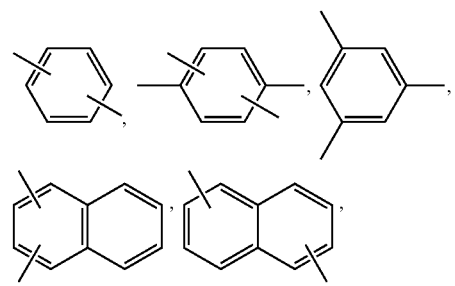

-continued

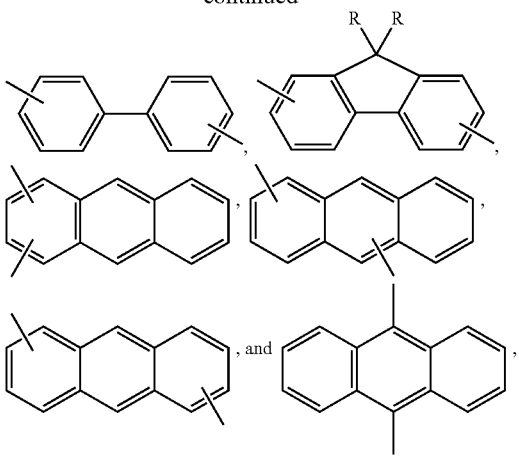

wherein, R is at least one selected from the group consisting of hydrogen, halogen, nitryl, alkyl, cycloalkyl, alkyloxy, alkenyl, amine, aryl, polyaryl, arylalkyl, and propenyloxy.

6. The organic electroluminescent material of claim 5, wherein R is at least one selected from the substituted or unsubstituted group consisting of alkyl having 1 to 10 carbon atoms, cycloalkyl having 1 to 10 carbon atoms, alkyloxy having 1 to 10 carbon atoms, alkenyl having 1 to 10 carbon atoms, amine, aryl having 6 to 30 carbon atoms, polyaryl having 6 to 30 carbon atoms, arylalkyl having 6 to 30 carbon atoms, and propenyloxy having 3 to 10 carbon atoms.

7. The organic electroluminescent material of claim 1, wherein X has at least two free radicals, and n is at least 2.

8. An organic electroluminescent element comprising two electrodes and at least one organic electroluminescent layer sandwiched between the electrodes, wherein the organic electroluminescent layer comprises an organic electroluminescent material of the formula:

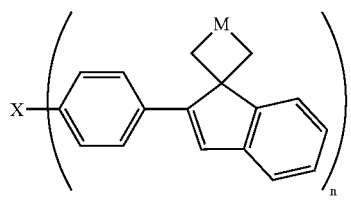

wherein M is at least one selected from the group consisting of —CH$_2$—, —CH$_2$CH$_2$—, —CH$_2$CH$_2$CH$_2$—, —CH$_2$C(CH$_3$)2CH2—, and —CH$_2$YCH$_2$—, X is at least one selected from the group consisting of oxygen, sulfur, nitrogen, carbon, alkyl, silicon, silyl, phosphorus, aryl, and polyaryl, n is depending on the amount of free radicals of X, and Y is at least one selected from the group consisting of oxygen, sulfur, nitrogen and SiR$^1$R$^2$, R$^1$ and R$^2$ being at least one selected from the group consisting of substituted or unsubstituted alkyl having 1 to 10 carbon atoms, and substituted or unsubstituted aryl having 6 to 30 carbon atoms.

9. The element of claim 8, wherein X is at least one selected from the substituted or unsubstituted group consisting of aryl having 6 to 30 carbon atoms, and polyaryl having 6 to 30 carbon atoms.

10. The element of claim 8, wherein X is at least one selected from the group consisting of:

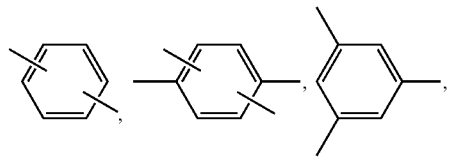

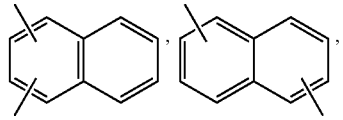

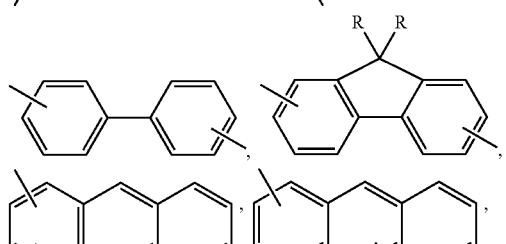

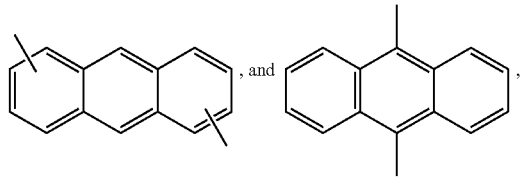

wherein, R is at least one selected from the group consisting of hydrogen, halogen, nitryl, alkyl, cycloalkyl, alkyloxy, alkenyl, amine, aryl, polyaryl, arylalkyl, and propenyloxy.

11. The element of claim 10, wherein R is at least one selected from the substituted or unsubstituted group consisting of alkyl having 1 to 10 carbon atoms, cycloalkyl having 1 to 10 carbon atoms, alkyloxy having 1 to 10 carbon atoms, alkenyl having 1 to 10 carbon atoms, amine, aryl having 6 to 30 carbon atoms, polyaryl having 6 to 30 carbon atoms, arylalkyl having 6 to 30 carbon atoms, and propenyloxy having 3 to 10 carbon atoms.

12. The element of claim 10, wherein X is at least one selected from the substituted or unsubstituted group consisting of aryl having 6 to 30 carbon atoms, and polyaryl having 6 to 30 carbon atoms.

13. The element of claim 12, wherein X is at least one selected from the group consisting of:

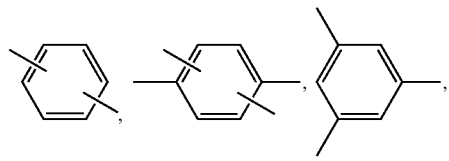

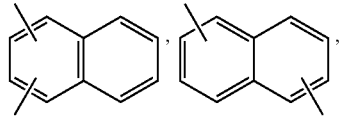

-continued

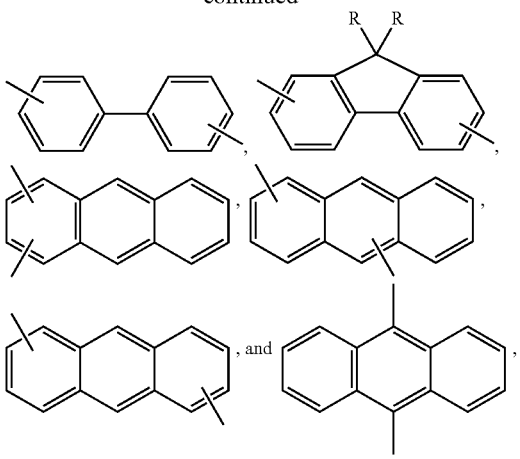

wherein, R is at least one selected from the group consisting of hydrogen, halogen, nitryl, alkyl, cycloalkyl, alkyloxy, alkenyl, amine, aryl, polyaryl, arylalkyl, and propenyloxy.

14. The element of claim 13, wherein R is at least one selected from the substituted or unsubstituted group consisting of alkyl having 1 to 10 carbon atoms, cycloalkyl having 1 to 10 carbon atoms, alkyloxy having 1 to 10 carbon atoms, alkenyl having 1 to 10 carbon atoms, amine, aryl having 6 to 30 carbon atoms, polyaryl having 6 to 30 carbon atoms, arylalkyl having 6 to 30 carbon atoms, and propenyloxy having 1 to 10 carbon atoms.

15. The element of claim 8, wherein X has at least two free radicals, and n is at least 2.

16. The element of claim 8, wherein the organic electroluminescent layer further comprises an aryl amino compound.

17. The element of claim 16, wherein the aryl amino compound is substituted with aryl group.

18. The element of claim 16, wherein the aryl amino compound is substituted with polyaryl group.

19. The element of claim 16, wherein the glass transition temperature of the organic electroluminescent layer is higher than 100° C.

20. The element of claim 8, wherein the organic electroluminescent material is doped in the organic electroluminescent layer.

21. The element of claim 20, wherein the doping ratio of the organic electroluminescent material is greater than 0.01 wt%.

22. The element of claim 20, wherein the doping ratio of the organic electroluminescent material is less than 10 wt%.

23. The element of claim 8, wherein the organic electroluminescent material is doped in a hole transporting layer of the organic electroluminescent layer.

* * * * *